(12) United States Patent
Kim (10) Patent No.: US 7,224,223 B2
(45) Date of Patent: May 29, 2007

(54) FEED-FORWARD POWER AMPLIFIER (75) Inventor: Young-Jin Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 112 days.

(21) Appl. No.: 11/081,931

(22) Filed: Mar. 16, 2005

(65) Prior Publication Data

US 2005/0218979 A1 Oct. 6, 2005

(30) Foreign Application Priority Data

Apr. 1, 2004 (KR) ............ 10-2004-0022505

(51) Int. Cl.
*H03F 1/26* (2006.01)
*H03F 3/66* (2006.01)
(52) U.S. Cl. .................. 330/151; 330/52
(58) Field of Classification Search ............ None
See application file for complete search history.

(56) References Cited

U.S. PATENT DOCUMENTS

| | | |
|---|---|---|
| 5,781,069 A | 7/1998 | Baskin |
| 5,808,512 A | 9/1998 | Bainvoll et al. ............ 330/151 |
| 5,867,064 A | 2/1999 | Van Horn et al. |
| 5,917,375 A * | 6/1999 | Lisco et al. ................ 330/151 |
| 6,794,938 B2 * | 9/2004 | Weldon ..................... 330/149 |
| 7,053,709 B1 * | 5/2006 | Darvish-Zadeh et al. ... 330/149 |

FOREIGN PATENT DOCUMENTS

| | | |
|---|---|---|
| KR | 1020010047123 | 6/2001 |
| KR | 2001-104192 | 11/2001 |
| KR | 1020020070572 | 9/2002 |

* cited by examiner

*Primary Examiner*—Benny T. Lee
*Assistant Examiner*—Alan Wong
(74) *Attorney, Agent, or Firm*—F. Chau & Associates, LLC (57) ABSTRACT

In a feed-forward power amplifier, a main path amplifies a power level of an input signal to generate a path turning signal, an error path receives the input signal and controls a gain or a phase of a second order intermodulation component in the path turning signal to generate an intermodulation compensation signal, and a first synthesizer generates an output signal responsive to the path turning signal and the intermodulation compensation signal, achieving linearity.

18 Claims, 6 Drawing Sheets

FEED-FORWARD POWER AMPLIFIER

CROSS-REFERENCE TO RELATED APPLICATION

This application claims foreign priority under 35 USC § 119 to Korean Patent Application No. 2004-22505, filed on Apr. 1, 2004, the contents of which are herein incorporated by reference in their entirety.

BACKGROUND OF THE INVENTION

1. Field of the Invention

The present invention relates to power amplifiers, and more particularly, to feed-forward power amplifiers.

2. Description of the Related Art

It is well known in the pertinent art that all amplifiers distort an input signal to varying degrees. The distortion typically becomes greater as the power levels are increased. When signals pass through non-linear radio-frequency (RF) amplifiers, the signals may undergo distortions resulting in a spreading of the spectrum beyond the allocated channel and a reducing of performance. The inefficiency and high cost of conventional linear RF amplifiers (e.g. Class A) have a negative effect on base station infrastructure equipment and operation. A more ideal amplifier would therefore be linear and power-efficient.

To linearize power amplifiers, feedback methods and feed-forward methods are used. However, feedback methods may cause power amplifiers to oscillate at high frequencies, and thus, a certain amount of instability can be observed in the feedback methods. Therefore, the feed-forward methods are widely used.

In a feed-forward method, an error signal is extracted and separately amplified by an error amplifier so that the error signal may be removed from an output signal of a main amplifier. Therefore, circuits are more complicated in the feed-forward methods and power efficiency is reduced due to the use of the error amplifier. In addition, a gain of the power amplifier and the distortion characteristics can vary with a supply voltage and temperature, thus limiting the amount of correction.

Figure 1:
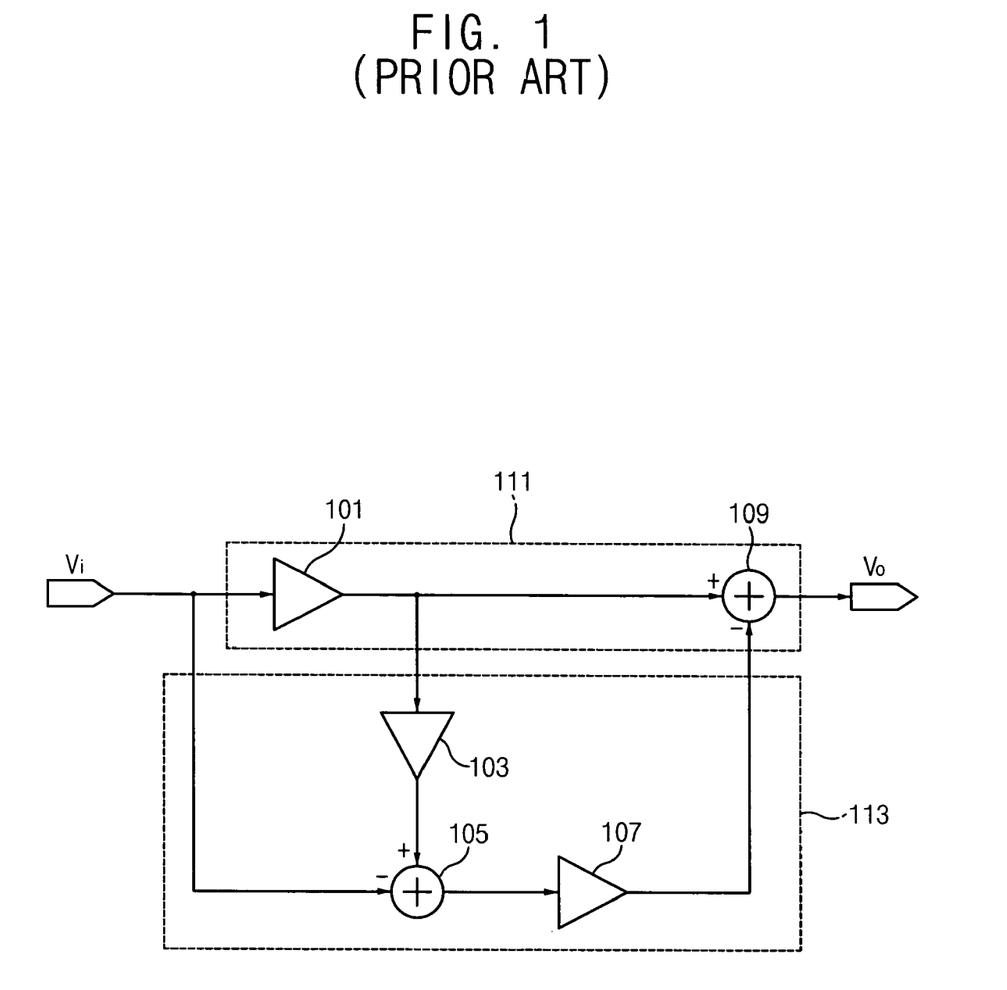
FIG. 1 is an exemplary block diagram illustrating a conventional feed-forward amplifier.

FIG. 1 is an exemplary block diagram illustrating a conventional feed-forward amplifier. Referring to FIG. 1, the conventional feed-forward amplifier includes a main path 111 and an error path 113.

The main path 111 includes a main amplifier 101 that amplifies a power level of an input signal Vi. Due to the nonlinearity of the main power amplifier 101, an intermodulation signal may be generated at an output terminal of the main amplifier 101. An output signal of the main amplifier 101, including such intermodulation signal, is then applied to a first subtractor 109.

The error path 113 includes an attenuator 103, a second subtractor 105 and an error amplifier 107. A signal may be distorted or an intermodulation signal may be generated in the error path 113 based on the input signal Vi of the conventional feed-forward amplifier. Particularly, a third order intermodulation component IM3 may be extracted from the input signal Vi in the error path 113 of the FIG. 1.

The attenuator 103 has a gain that is a reciprocal of a gain of the main amplifier 101 in the main path 101. Therefore, when a voltage gain of the main amplifier 101 corresponds to Av, a voltage gain of the attenuator 103 corresponds to 1/Av. A carrier signal and the intermodulation signal that are amplified in the main amplifier 101 are attenuated by the attenuator 103 and applied to the second subtractor 105.

The carrier input signal Vi of the feed-forward amplifier and an output signal of the attenuator 103 are applied to the second subtractor 105. A carrier component is then removed by the second substractor 105 to generate the error signal having only an intermodulation component therein.

The error signal is applied to the error amplifier 107, and a voltage gain of the error amplifier 107 corresponds to Av. The error signal is amplified and applied to the first subtractor 109.

An output signal of the main amplifier 101 and an output signal of the error amplifier 107 are applied to the first subtractor 109. Since the intermodulation component or a distortion component is removed from the output signal of the main amplifier 101, the carrier signal may be linearly amplified.

However, the conventional feed-forward power amplifier has some disadvantages when both a signal in the main path and the error signal have high frequencies, thereby limiting the control of a gain or a phase thereof. In addition, delays of signals generated in the respective paths need to be compensated. To compensate the delays of signals, a delay path should be separately equipped. However, in such a method, the third order intermodulation components must be controlled, which is difficult.

SUMMARY

An exemplary embodiment of the present disclosure provides a feed-forward power amplifier. The feed-forward power amplifier includes a main path, an error path and a first synthesizer. The main path amplifies a power level of an input signal to generate a path turning signal. The error path controls a gain or a phase of a second order intermodulation component in the path turning signal based on the input signal, to generate an intermodulation compensation signal. The first synthesizer generates an output signal having pilot tones based on the path turning signal and the intermodulation compensation signal. The error path includes a first sub-path, a second sub-path, a second synthesizer and a third sub-path. The first sub-path extracts the second order intermodulation component from the path tuning signal of the main path. The second sub-path transmits the input signal. The second synthesizer synthesizes the second order intermodulation component of the first sub-path and the input signal of the second sub-path to generate a synthesizing signal. The third sub-path generates the intermodulation compensation signal having a third order intermodulation component based on the synthesizing signal. The first sub-path includes at least one filtering unit for selectively passing the second order intermodulation component and a gain and/or phase control unit for controlling a gain or a phase of a filtered output signal of the filtering unit.

Another exemplary embodiment of the present disclosure provides a feed-forward power amplifier. The feed-forward power amplifier includes a main power amplifier, an extracting unit, a gain and/or phase control unit, a first synthesizer, a squarer and a second synthesizer. The main power amplifier amplifies a power level of an input signal to generate a path turning signal. The extracting unit extracts a second order intermodulation component from the path turning signal. The gain and/or phase control unit controls a gain or a phase of the extracted second order intermodulation component of the path turning signal. The first synthesizer synthesizes the input signal of the main power amplifier and the second order intermodulation component that is gain or phase controlled by the gain and/or phase control unit to generate a synthesizing signal. The squarer generates an intermodulation compensation signal having a third order intermodulation component based on the synthesizing signal of the first synthesizer. The second synthesizer generates an output signal having pilot tones based on the path turning signal and the intermodulation compensation signal. The feed-forward power amplifier may further comprise a band-pass filter for selectively passing the third order intermodulation component in the intermodulation compensation signal of the squarer.

Another exemplary embodiment of the present disclosure provides a feed-forward power amplifying method. In the method, an input signal is amplified to generate a path turning signal. A second order intermodulation component is generated based on the path turning signal. The second order intermodulation component is synthesized with the input signal to generate a synthesizing signal. An intermodulation compensation signal having a third order intermodulation component is generated based on the synthesizing signal. An output signal having pilot tones is generated based on the path turning signal and the intermodulation compensation signal.

BRIEF DESCRIPTION OF THE DRAWINGS

The present invention will become more apparent to those of ordinary skill in the pertinent art by describing, in detail, exemplary embodiments thereof with reference to the attached drawings, wherein like elements may be represented by like reference numerals, and which are given by way of illustration only and thus do not limit embodiments of the present disclosure.

DETAILED DESCRIPTION OF PREFERRED EMBODIMENTS

The present invention will become more apparent to those of ordinary skill in the art by describing, in detail, exemplary embodiments thereof, which are given by way of illustration only and thus do not limit alternate embodiments of the invention. According to exemplary embodiments of the present disclosure, linearity may be achieved with a feed-forward power amplifier.

Figure 2:
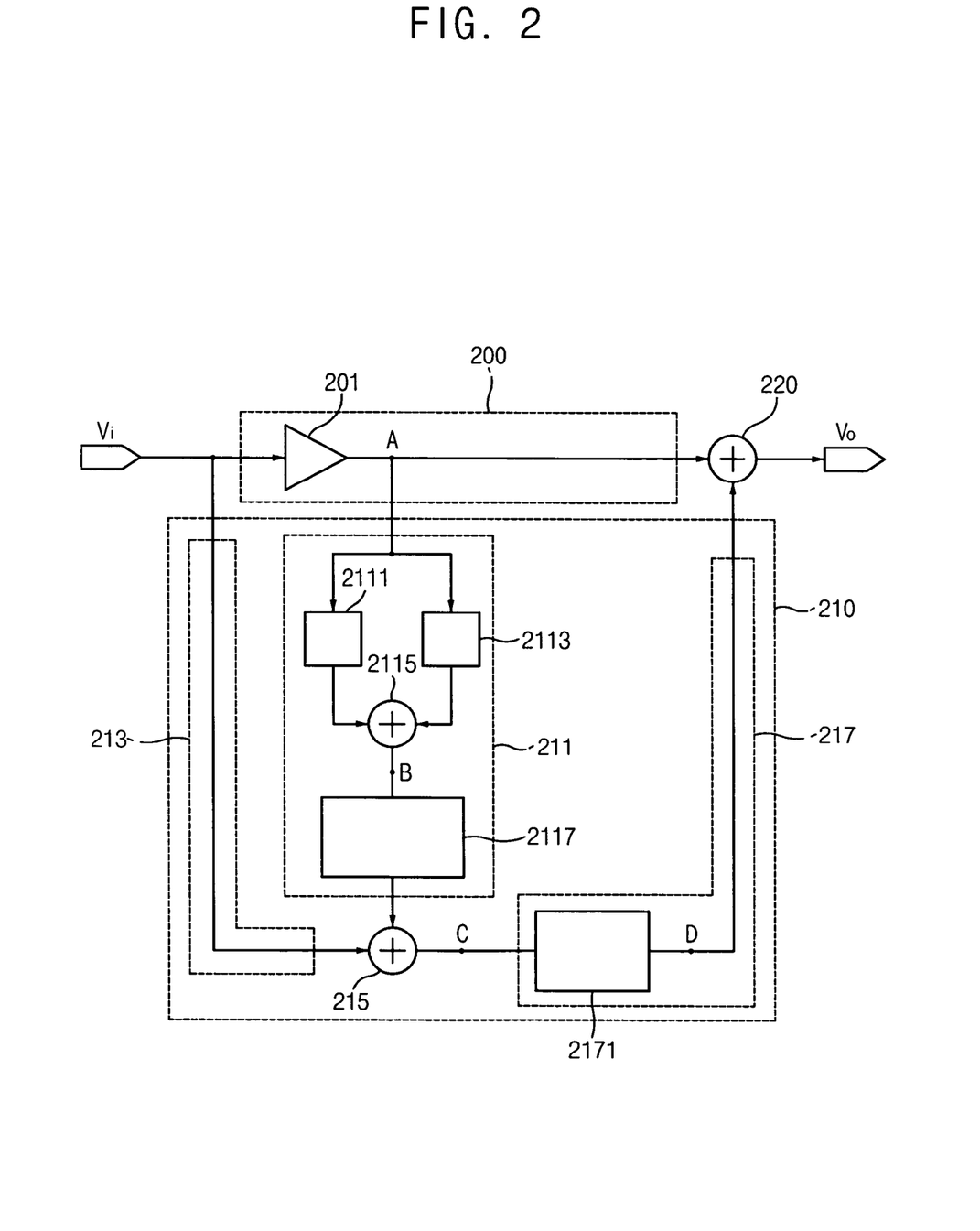
FIG. 2 is a block diagram illustrating a feed-forward power amplifier according to an exemplary embodiment of the present disclosure.

FIG. 2 is an exemplary block diagram illustrating a feed-forward power amplifier according to an exemplary embodiment of the present disclosure. Referring to FIG. 2, the power amplifier includes a main path 200, an error path 210 and a first synthesizer 220. A power level of an input signal Vi is amplified to generate a path turning signal in the main path. For illustrative purposes, the input signal has two tones of different frequencies, W1 and W2, to test performance of the feed-forward power amplifier. Such a test type is referred to as a two-tone test.

The main path 200 includes a main power amplifier 201. The main amplifier 201 amplifies the power level of the input signal Vi to generate the path turning signal that includes an intermodulation component. That is, the main power amplifier 201 is nonlinear.

The error path 210 includes a first sub-path 211, a second sub-path 213, a second synthesizer 215 and a third sub-path 217. In the first sub-path 211, second order intermodulation components are extracted from the path turning signal outputted from the main power amplifier 201. Therefore, only the second order intermodulation components are extracted from the path turning signal having multiple intermodulation components. In order to extract the second order intermodulation components, the first sub-path 211 may include filtering units 2111 and 2113, a third synthesizer 2115 and a gain/phase controller 2117.

The filtering units 2111 and 2113 may correspond to band-pass filters. Since the input signal includes two tones of different frequencies, W1 and W2, for the two-tone test, two band-pass filters 2111 and 2113 are required. Thus, the number of band-pass filters can be varied according to the number of tones in the input signal.

When W2 is an angular frequency larger than W1, a first band-pass filter 2111 passes a frequency corresponding to W2−W1 in the second order intermodulation components, and a second band-pass filter 2113 passes a frequency corresponding to W2+W1 in the second order intermodulation components. The third synthesizer 2115 synthesizes the second order intermodulation components that are extracted by the filtering units 2111 and 2113.

The second order intermodulation component synthesized by the third synthesizer 2115 is applied to the gain/phase control unit 2117. The applied second order intermodulation component is gain or phase controlled by the gain/phase control unit 2117 and applied to the second synthesizer 215. The gain/phase control unit 2117 controls the gain of the input second order intermodulation components so that the intermodulation components in the error path may have a magnitude substantially equal to the intermodulation components in the path turning signal. The gain/phase control unit 2117 controls the phase of the second order intermodulation components so that a phase of the intermodulation component may be substantially equal to that of the input signal Vi that is applied to the second synthesizer 215.

The second sub-path 213 transmits the input signal Vi to the second synthesizer 215. The second synthesizer 215 synthesizes the input signal Vi and an output signal of the gain/phase control unit 2117 to generate a synthesizing signal. Therefore, an output signal of the second synthesizer 215 includes pilot tones having frequencies of W1 and W2, respectively, and second order intermodulation components having frequencies of W2+W1 and W2−W1, respectively.

The third sub-path 217 generates an intermodulation compensation signal having a third order intermodulation component. Here, the third sub-path 217 has a squarer 2171. The squarer 2171 receives an output of the second synthesizer 215 to produce a square of the output of the second synthesizer 215.

For example, the squarer 2171 may correspond to a mixer. The mixer may be a passive mixer using a diode, or an active mixer using a transistor. When the mixer is used in a receiver, the mixer produces a signal corresponding to a difference between two frequencies. When the mixer is used in a transmitter, the mixer produces a signal corresponding to a sum of the two frequencies. However, in the present embodiment, the mixer is used to produce the intermodulation compensation signal having the third order intermodulation component by squaring the output of the second synthesizer 215.

Therefore, the intermodulation compensation signal includes pilot tones having frequencies of W1 and W2, respectively, a second order intermodulation component having frequencies of W2+W1 and W2−W1, and a third order intermodulation component having frequencies of 2W2−W1 and 2W1−W2.

The intermodulation compensation signal is applied to the first synthesizer 220. In addition, the first synthesizer 220 receives the path turning signal generated by the main power amplifier 201. The first synthesizer 220 synthesizes the path turning signal and the intermodulation compensation signal, and removes the intermodulation component from the path turning signal to generate an output signal Vo having predetermined amplitude.

Therefore, the intermodulation component is not contained in the output signal Vo obtaining the gain of an input pilot tone.

Figure 3:
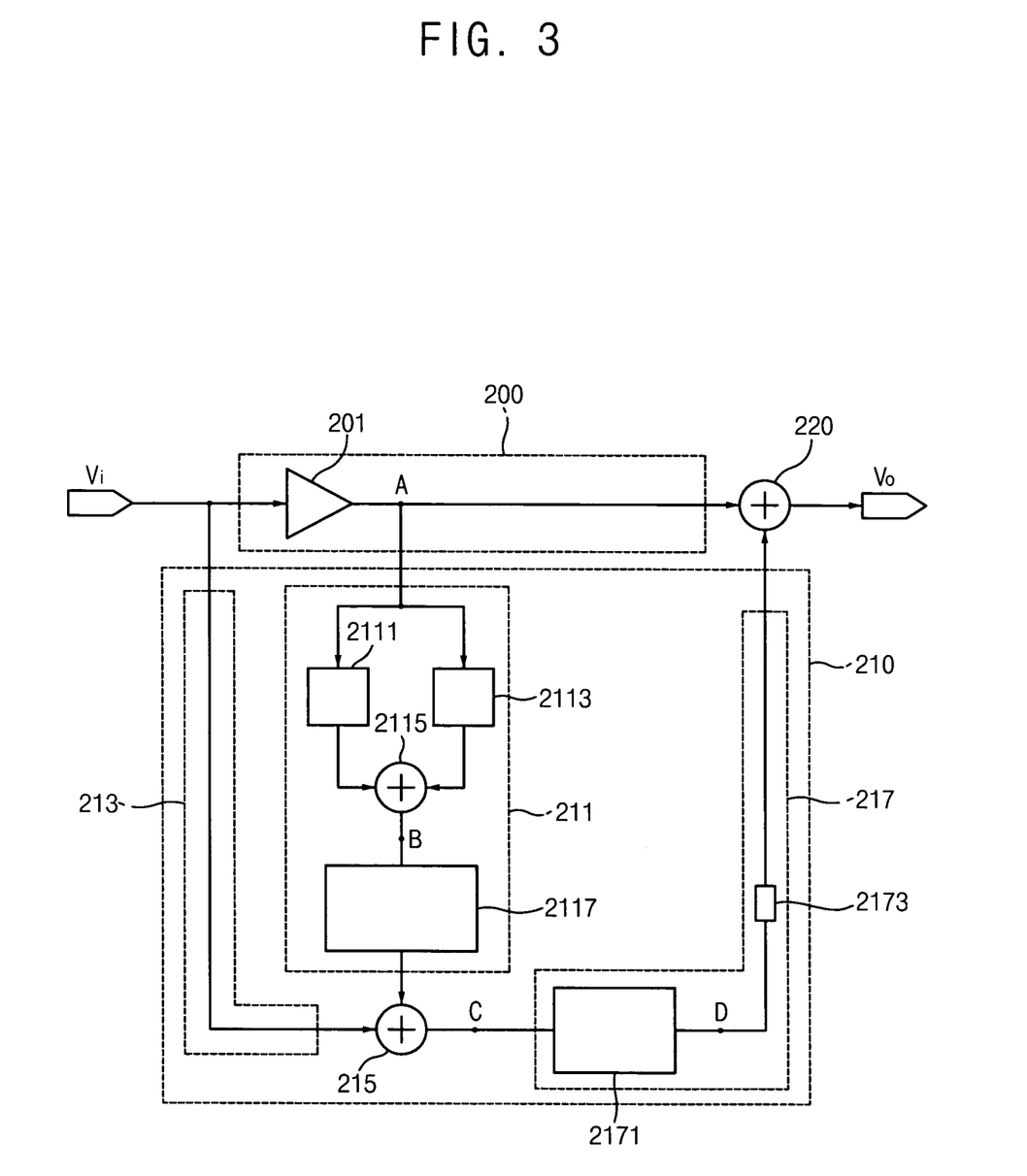
FIG. 3 is a block diagram illustrating a feed-forward power amplifier according to another exemplary embodiment of the present disclosure.

FIG. 3 is a block diagram illustrating a feed-forward power amplifier according to another exemplary embodiment of the present disclosure. Referring to FIG. 3, the third sub-path 217 further includes a third band-pass filter 2173. The other elements shown in FIG. 3 are similar in form and function to analogous elements already described with reference to FIG. 2. Therefore, redundant description is avoided.

The third band-pass filter 2173 passes the pilot tone and the third order intermodulation component in an output signal of the squarer 2171. Therefore, the intermodulation compensation signal generated by the third band-pass filter 2173 has only the pilot tone and the third order intermodulation component. The intermodulation compensation signal is applied to the first synthesizer 220 and used to cancel the intermodulation component from the path turning signal that is also applied to the first synthesizer 220.

Figure 4A:
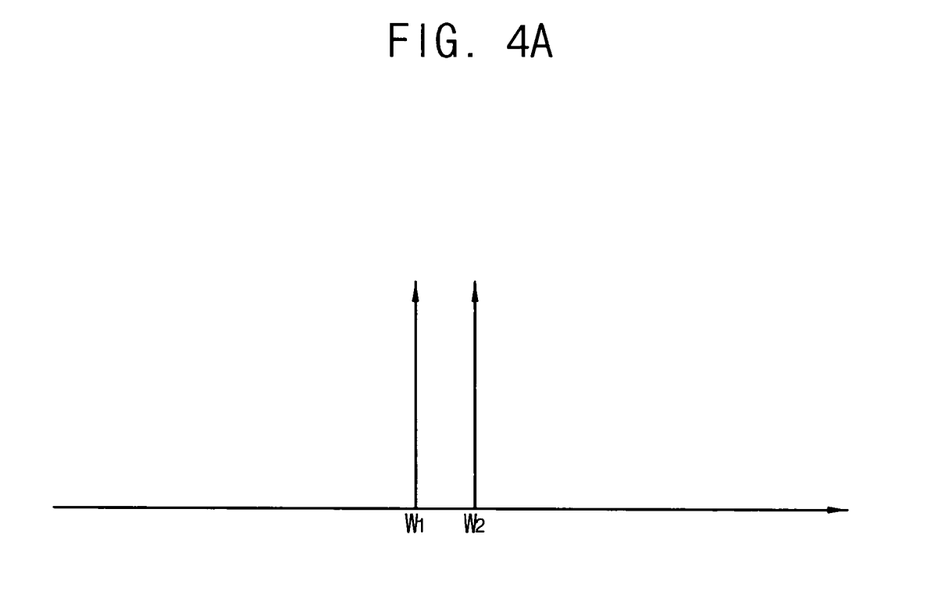
FIGS. 4A through 4F are schematic views illustrating frequency spectrums of a feed-forward power amplifier according to an exemplary embodiment of the present disclosure.

FIGS. 4A through 4F are schematic views illustrating frequency spectrums of a feed-forward power amplifier according to an exemplary embodiment of the present disclosure. Referring to FIG. 4A, the input signal Vi has two tones of different frequencies W1 and W2 for the two-tone test. That is, the Vi may be designated as E1 cos W1+E1 cos W2.

Figure 4B:
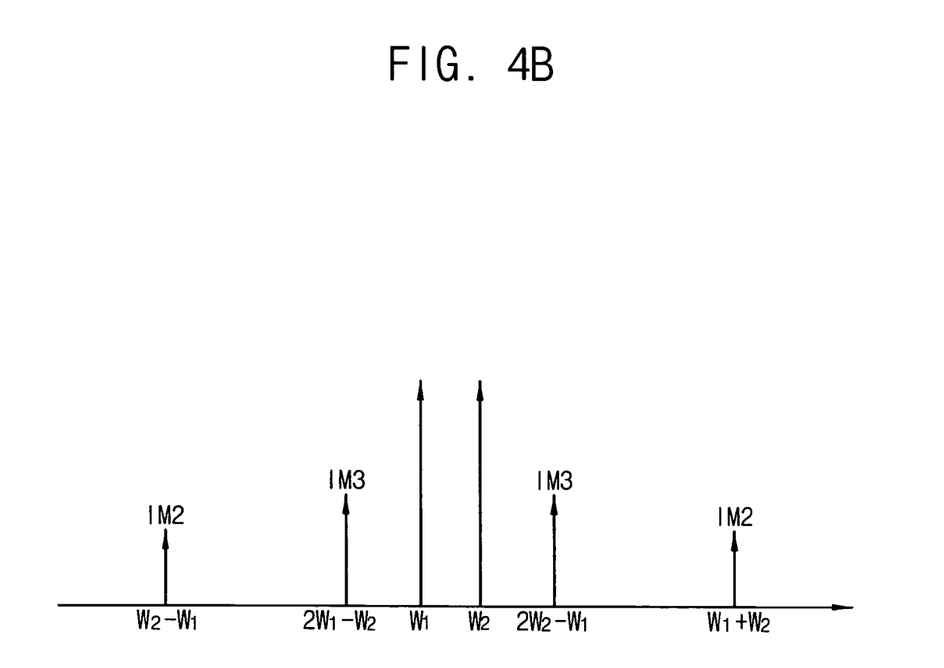

FIG. 4B is a schematic view illustrating a frequency spectrum of a signal at a node A in FIG. 2. Referring to FIGS. 2 and 4B, the input signal Vi is applied to a main power amplifier 201 and the power level of the input signal Vi is amplified to be outputted. An output signal of the main power amplifier 201 corresponds to the path turning signal. Since the main power amplifier 201 has nonlinear time-invariant characteristics, the output signal of the main power amplifier 201 is expressed by the following Equation 1.

$$y(t) \approx \alpha 1\, Vi(t) + \alpha 2\, Vi(t)^2 + \alpha 3\, Vi(t)^3 + \quad \text{[Equation 1]}$$

Therefore, when the Vi is designated as E1 cos W1+E1 cos W2, the signal $y_1(t)$ at the node A is expressed by the following equation 2.

$$y_1(t) = \quad \text{[Equation 2]}$$
$$\alpha_1 E_1 [\cos w_1 t + \cos w_2 t] + \alpha_2 E_1^2 \left[1 + \frac{1}{2}\cos 2w_1 t + \cos 2w_2 t + \cos(w_1+w_2)t + \cos(w_1-w_2)t\right] +$$
$$\alpha_3 E_1^3 \left[\frac{9}{4}\cos w_1 t + \frac{9}{4}\cos 2w_2 t + \frac{1}{4}\cos 3w_1 t + \right.$$

-continued
$$\left. \frac{1}{4}\cos 3w_2 t + \frac{3}{4}\cos(2w_1 - w_2)t + \right.$$
$$\left. \frac{1}{4}\cos 3w_2 t + \frac{3}{4}\cos(w_1 - 2w_2)t + \ldots \right]$$

Therefore, it can be noted from the above Equation 2 that the third order intermodulation components IM3 are generated at frequencies of 2W2−W1 and 2W1−W2, being spaced apart from the pilot tones having frequencies of W1 and W2 by a small frequency difference. In addition, the second order intermodulation components IM2 are generated at frequencies of W1+W2 and W2−W1 being spaced apart from the pilot tones by a predetermined frequency difference. In addition, the path turning signal outputted from the main power amplifier 201 may have spurious components due to signal leakage at adjacent channels, or may have signal distortion due to intermodulation distortion. These are generally referred to as intermodulation signals.

Figure 4C:
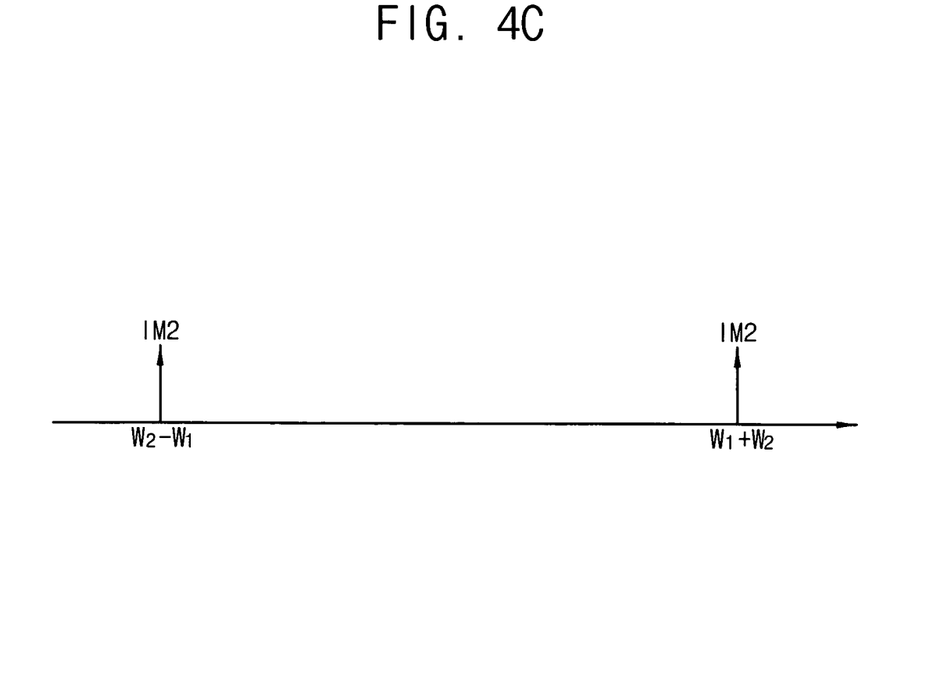

FIG. 4C is a schematic view illustrating a frequency spectrum of a signal at a node B in FIG. 2. Referring to FIGS. 2 and 4C, the first band-pass filter 2111 in the first sub-path 211 passes a component of cos(w2−w1), and the second band-pass filter 2113 passes a component of cos(w1+w2). Signals passing through the respective band-pass filters 2111 and 2113 are applied to the third synthesizer 2115 to be synthesized and then applied to the gain/phase control unit 2117. A signal that is applied to the gain/phase control unit 2117 is expressed by the following Equation 3.

$$y2(t)=\alpha 2E1^2[\cos(w1+w2)t+\cos(w2-w1)t]=E2[\cos(w1+w2)t+\cos(w2-w1)t] \quad \text{[Equation 3]}$$

The y2 signal that is applied to the gain/phase control unit 2117 is gain or phase controlled. Therefore, the first synthesizer 220 may remove the intermodulation component from the path turning signal.

Figure 4D:
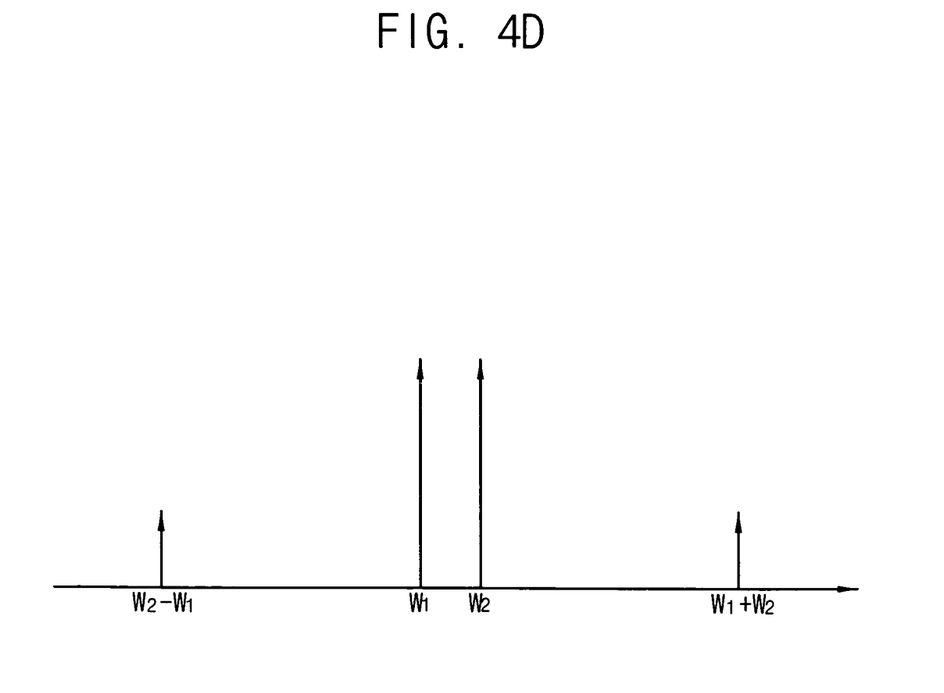

FIG. 4D is a schematic view illustrating a frequency spectrum of a signal at a node C in FIG. 2. Referring to FIGS. 2 and 4D, an output signal of the second synthesizer 215 is expressed by the following Equation 4, wherein the second synthesizer 215 synthesizes an output signal of the gain/phase control unit 2117 and an input signal Vi.

$$y3(t)=E1[\cos w1\, t+\cos w2\, t]+E3[\cos(w1+w2)t+\cos(w2-w1)t] \quad \text{[Equation 4]}$$

From the Equation 4, it can be known that the output signal y3 of the second synthesizer 215 includes pilot tones and second order intermodulation components. The output signal y3 of the second synthesizer 215 is applied to the squarer 2171. The squarer 2171 in the third sub-path 217 produces a square of an input signal y3. A mixer may implement the squarer 2171, with the input signal y3 serving as a switching control signal and a radio frequency (RF) input signal.

Figure 4E:
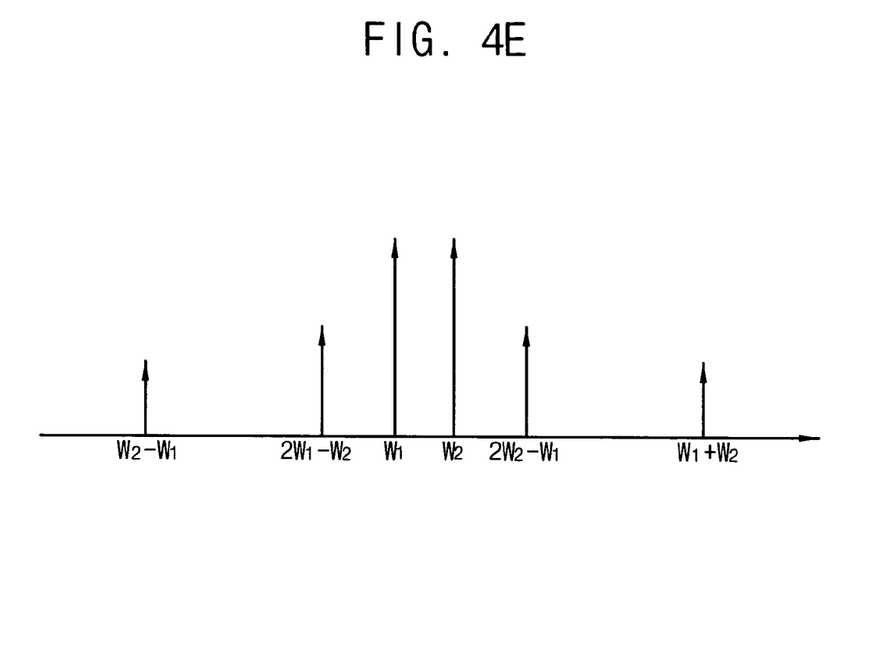

FIG. 4E is a schematic view illustrating a frequency spectrum of a signal at a node D in FIG. 2. Referring to FIGS. 2 and 4E, an output of the squarer 2171 corresponds to a square of the input signal y3. The output signal of the squarer 2171 is expressed by the following Equation 5.

$$y4(t)=E1^2[\cos w1\, t+\cos w2\, t]^2+E2[\cos(w1+w2)t+\cos(w2-w1)t]^2+2E1\, E3[\cos w1\, t+\cos w2\, t][\cos(w1+w2)t+\cos(w2-w1)t] \quad \text{[Equation 5]}$$

From the equation 5, it can be known that the output signal y4 of the second synthesizer 215 includes a second order intermodulation component, a third order intermodulation component and a fourth order intermodulation component, and so forth. Therefore, when the output signal y1 of the main power amplifier 201 and the output signal y4 are applied to the first synthesizer 220, the intermodulation components are removed from the output signal y1 of the main power amplifier 201, and an amplified signal Vo containing only the pilot tones is outputted.

Figure 4F:
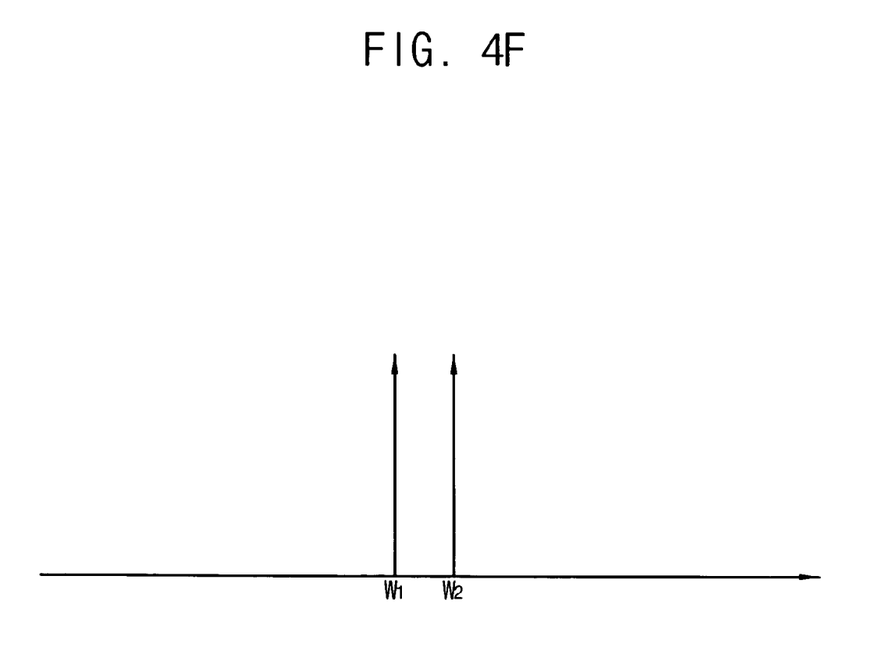

FIG. 4F is a schematic view illustrating a frequency spectrum of a Vo signal in FIG. 2. Referring to FIGS. 2 and 4F, the intermodulation compensation signal that is applied to the first synthesizer 220 has a magnitude substantially the same as a magnitude of the intermodulation component of the path turning signal upon the control of the gain/phase control unit 2117. In addition, the intermodulation compensation signal and the path turning signal may have substantially the same phases or 180 degree phase difference to each other upon the control of the gain/phase control unit 2117. Alternatively, the gain/phase control unit may implement another method of controlling the gain and phase as long as the intermodulation component is removed from the path turning signal. When the intermodulation component is removed from the path turning signal, the output signal Vo contains pilot tones in the original input signal and thus, the feed-forward power amplifier can achieve linearity.

In addition, when the third sub-path 217 further includes a third band-pass filter, the intermodulation compensation signal may include a pilot tone component and a third order intermodulation component. In this case, the intermodulation compensation signal is expressed by the following Equation 6.

$$y4(t)=E1\ E3[\cos(2w1-w2)t+\cos(w1-2w2)t+\cos w2\ t]\quad \text{[Equation 6]}$$

From the Equation 6, it can be known that the intermodulation compensation signal in the third sub-path 217 that is applied to the first synthesizer 220 has pilot tones and third order intermodulation components. The intermodulation compensation signal is applied to the first synthesizer 220 to be used in removing the intermodulation component from the path turning signal that is also applied thereto.

Therefore, linearity may be achieved with the feed-forward power amplifier by controlling the second order intermodulation component having a relatively low frequency instead of the third order intermodulation component having a relatively high frequency.

According to the present disclosure, the second order intermodulation component is gain or phase controlled in the error path of the feed-forward power amplifier to cancel intermodulation components in the path turning signal of the main path. The intermodulation component signal may be more easily controlled by controlling the second order intermodulation component having a relatively low frequency instead of controlling the third order intermodulation component having a relatively high frequency. Also, the intermodulation components in the path turning signal of the main path may be easily canceled.

Having thus described exemplary embodiments of the present disclosure, it is to be understood that the invention defined by the appended claims is not to be limited by particular details set forth in the above description, as many apparent variations thereof are possible and may be recognized by those of ordinary skill in the pertinent art without departing from the spirit or scope thereof as hereinafter claimed.

What is claimed is:

1. A feed-forward power amplifier comprising:
   a main path configured to amplify a power level of an input signal and generate a path turning signal; and
   an error path in signal communication with the main path configured to receive the input signal and control at least one of a gain and a phase of a second order intermodulation component from the path turning signal to generate an intermodulation compensation signal; and
   a first synthesizer in signal communication with the main path and the error path configured to generate an output signal responsive to the intermodulation compensation signal,
   wherein the error path includes:
   a first sub-path configured to extract the second order intermodulation component from the path tuning signal of the main path;
   a second sub-path configured to transmit the input signal;
   a second synthesizer configured to synthesize the second order intermodulation component of the first sub-path and the input signal of the second sub-path so as to generate a synthesizing signal; and
   a third sub-path configured to generate the intermodulation compensation signal having a third order intermodulation component based on the synthesizing signal.

2. The feed-forward power amplifier of claim 1 wherein the first synthesizer is configured to generate an output signal having pilot tones based on the path turning signal and the intermodulation compensation signal.

3. The feed-forward power amplifier of claim 1, wherein the main path includes a main power amplifier for amplifying a power level of the input signal.

4. The feed-forward power amplifier of claim 1, wherein the first sub-path includes:
   at least one filtering unit configured to selectively pass the second order intermodulation component; and
   a gain and/or phase control unit configured to control a gain or a phase of a filtered output signal of the filtering unit.

5. The feed-forward power amplifier of claim 4, wherein the gain and/or phase control unit controls the gain or the phase of the filtered output signal of the filtering unit corresponding to the input signal of the main path so that the first synthesizer may remove the intermodulation components from the path turning signal based on the intermodulation compensation signal to generate the output signal having pilot tones.

6. The feed-forward power amplifier of claim 1, wherein the third sub-path includes a squarer for squaring the synthesizing signal of the second synthesizer to produce the intermodulation compensation signal.

7. The feed-forward power amplifier of claim 6, wherein the squarer comprises a mixer.

8. The feed-forward power amplifier of claim 7, wherein the mixer corresponds to at least one of a passive mixer using a diode and an active mixer using a transistor.

9. The feed-forward power amplifier of claim 6, wherein the third sub-path further includes a band-pass filter for selectively passing a predetermined frequency band of the intermodulation compensation signal.

10. The feed-forward power amplifier of claim 9, wherein the band-pass filter passes the third order intermodulation component from the intermodulation compensation signal of the squarer to generate the intermodulation compensation signal having the third order intermodulation component.

11. A feed-forward power amplifier comprising:
   a main power amplifier configured to amplify a power level of an input signal to generate a path turning signal;

an extracting unit in signal communication with the main power amplifier configured to extract a second order intermodulation component from the path turning signal;

at least one of a gain and a phase control unit in signal communication with the extracting unit configured to control a gain or a phase of the extracted second order intermodulation component of the path turning signal;

a first synthesizer in signal communication with the at least one of a gain and a phase control unit configured to synthesize the input signal of the main power amplifier and the second order intermodulation component that is gain or phase controlled by the gain and/or phase control unit to generate a synthesizing signal;

a squarer in signal communication with the first synthesizer configured to generate an intermodulation compensation signal having a third order intermodulation component based on the synthesizing signal of the first synthesizer; and a second synthesizer in signal communication with the squarer configured to generate an output signal responsive to the intermodulation compensation signal.

12. The feed-forward power amplifier of claim 11 wherein the second synthesizer is configured to generate an output signal having pilot tones based on the path turning signal and the intermodulation compensation signal.

13. The feed-forward power amplifier of claim 11, the squarer comprising a mixer using at least one of a diode and a transistor.

14. The feed-forward power amplifier of claim 11, the extracting unit comprising at least one band-pass filter for extracting at least one higher order intermodulation component from the path turning signal.

15. The feed-forward power amplifier of claim 11, further comprising a band-pass filter for selectively passing the third order intermodulation component in the intermodulation compensation signal of the squarer.

16. A feed-forward power amplifying method comprising:

amplifying an input signal to generate a path turning signal;

generating a second order intermodulation component based on the path turning signal;

synthesizing the second order intermodulation component and the input signal to generate a synthesizing signal;

generating an intermodulation compensation signal having a third order intermodulation component based on the synthesizing signal; and generating an output signal responsive to the intermodulation compensation signal, wherein generating the second order intermodulation component includes, extracting the second order intermodulation component from the path turning signal; and controlling at least one of a gain and a phase of the extracted second order intermodulation component.

17. The method of claim 16 wherein the generated output signal has pilot tones based on the path turning signal and the intermodulation compensation signal.

18. The method of claim 16 wherein the generated output signal bears a substantially linear relationship to the original input signal.

* * * * *